(12) United States Patent
Minari et al.

(10) Patent No.: US 11,205,668 B2
(45) Date of Patent: Dec. 21, 2021

(54) LIGHT RECEIVING DEVICE, METHOD OF MANUFACTURING LIGHT RECEIVING DEVICE, IMAGING DEVICE, AND ELECTRONIC APPARATUS

(71) Applicant: SONY CORPORATION, Tokyo (JP)

(72) Inventors: Hideki Minari, Kanagawa (JP); Shunsuke Maruyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 113 days.

(21) Appl. No.: 16/805,275

(22) Filed: Feb. 28, 2020

(65) Prior Publication Data

US 2020/0203411 A1 Jun. 25, 2020

Related U.S. Application Data

(62) Division of application No. 16/069,272, filed as application No. PCT/JP2016/083857 on Nov. 15, 2016, now Pat. No. 10,622,392.

(30) Foreign Application Priority Data

Jan. 20, 2016 (JP) ................................. 2016-008460

(51) Int. Cl.
*H01L 31/00* (2006.01)
*H01L 27/144* (2006.01)
(Continued)

(52) U.S. Cl.
CPC .......... *H01L 27/144* (2013.01); *H01L 27/146* (2013.01); *H01L 27/14623* (2013.01); *H01L 27/14649* (2013.01); *H01L 31/02* (2013.01); *H01L 31/0264* (2013.01); *H01L 31/0328* (2013.01); *H01L 31/10* (2013.01);
(Continued)

(58) Field of Classification Search
CPC ............... H01L 27/142; H01L 27/1421; H01L 27/1423; H01L 27/146; H01L 27/14649; H01L 31/02008; H01L 31/02168; H01L 31/0203; H01L 31/022425; H01L 31/068; H01L 31/0328; H01L 31/02021; H01L 31/02167; H01L 31/1864
See application file for complete search history.

(56) References Cited

U.S. PATENT DOCUMENTS

| 6,593,635 B2 | 7/2003 | Masaki et al. |
| 2007/0215900 A1 | 9/2007 | Maimon |
| 2018/0138662 A1* | 5/2018 | Yanashima .......... H01S 5/34333 |

FOREIGN PATENT DOCUMENTS

| CN | 1925164 | 3/2007 |
| CN | 101783345 | 7/2010 |

(Continued)

*Primary Examiner* — Cuong Q Nguyen
(74) *Attorney, Agent, or Firm* — Sheridan Ross P.C.

(57) ABSTRACT

A light receiving device includes: a photoelectric conversion layer that includes a first compound semiconductor, and absorbs a wavelength in an infrared region to generate electrical charges; a plurality of contact layers that include a second compound semiconductor, and are provided on the photoelectric conversion layer at spacing intervals with respect to one another; and a covering layer that is formed to cover a portion corresponding to the spacing intervals of a front surface of the photoelectric conversion layer and side surfaces of the respective contact layers, and includes a Group IV semiconductor.

20 Claims, 11 Drawing Sheets

(51) Int. Cl.
    *H01L 31/02*     (2006.01)
    *H01L 31/0264*     (2006.01)
    *H01L 31/10*     (2006.01)
    *H04N 5/33*     (2006.01)
    *H04N 5/369*     (2011.01)
    *H01L 27/146*     (2006.01)
    *H01L 31/0328*     (2006.01)
    *H01L 31/18*     (2006.01)

(52) U.S. Cl.
    CPC ........... *H01L 31/1864* (2013.01); *H04N 5/33* (2013.01); *H04N 5/369* (2013.01)

(56) References Cited

FOREIGN PATENT DOCUMENTS

| | | |
|---|---|---|
| CN | 103378236 | 10/2013 |
| CN | 104078478 | 10/2014 |
| CN | 104170372 | 11/2014 |
| JP | 2003-023173 | 1/2003 |
| JP | 2007-243100 | 9/2007 |
| JP | 2010-056173 | 3/2010 |
| JP | 2013-093385 | 5/2013 |

* cited by examiner

[ FIG. 1 ]
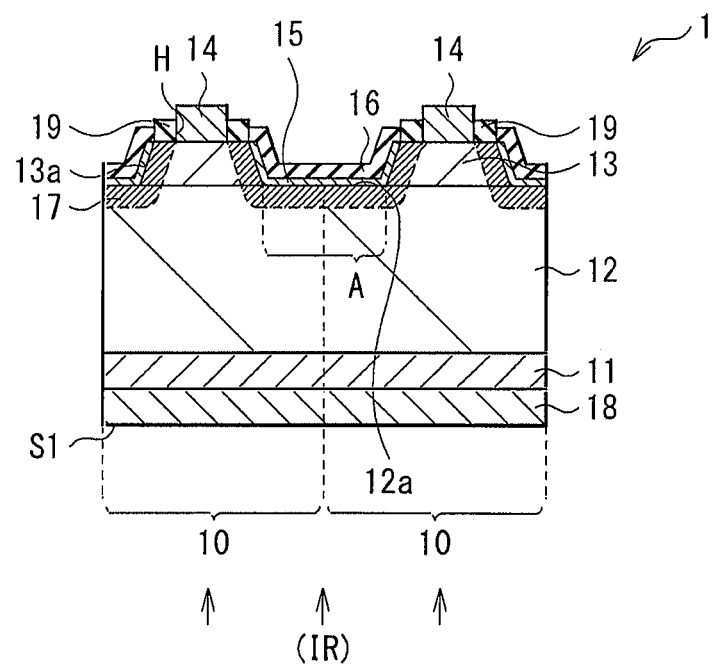
[ FIG. 2 ]
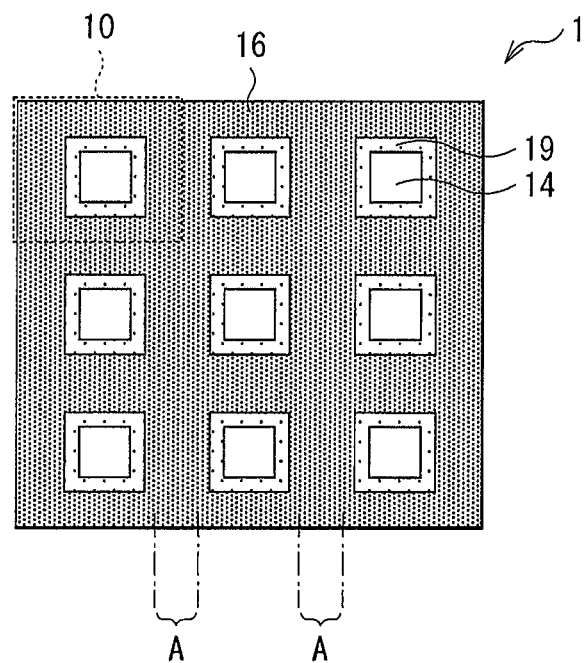

[ FIG. 3A ]
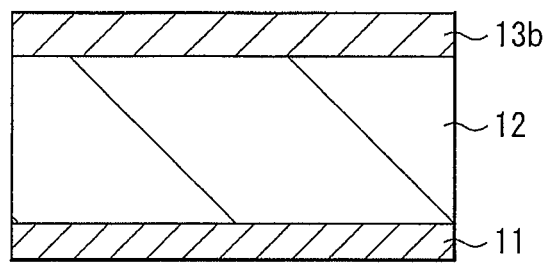
[ FIG. 3B ]
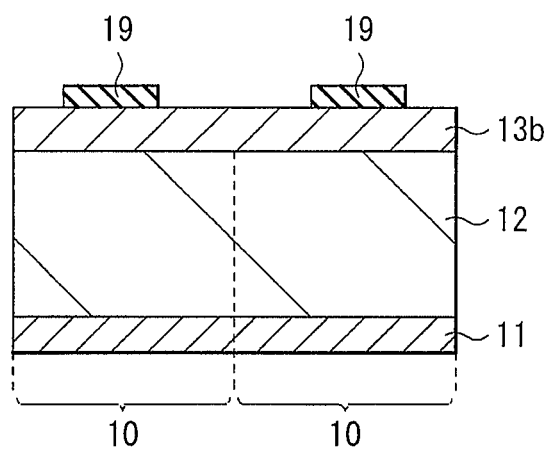
[ FIG. 3C ]
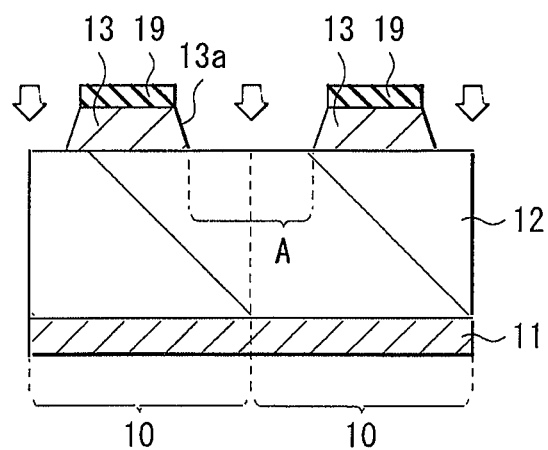

[ FIG. 4A ]
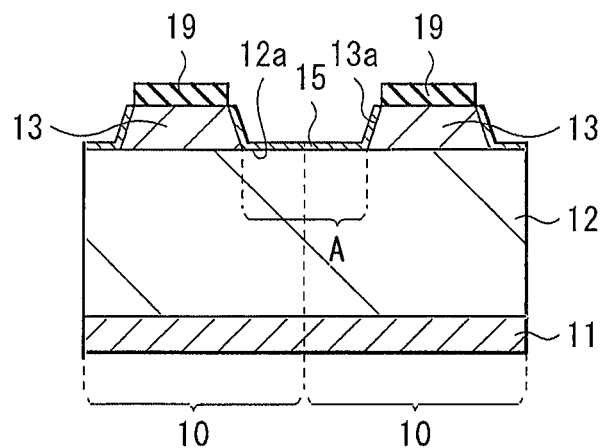
[ FIG. 4B ]
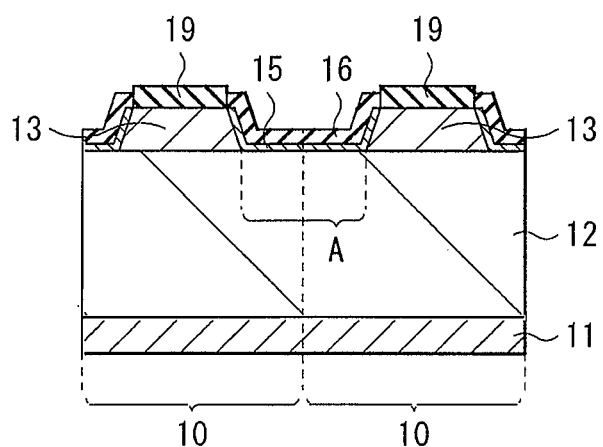
[ FIG. 4C ]
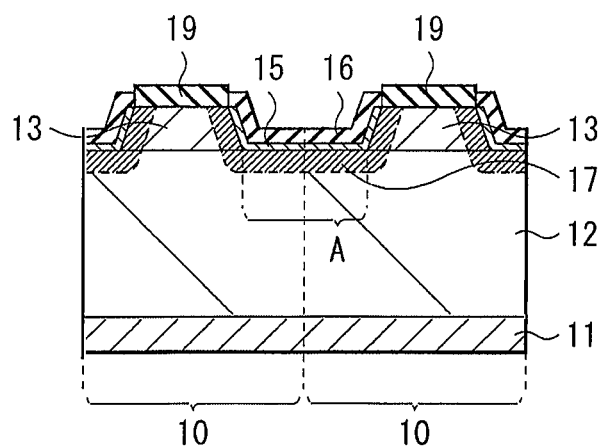

[ FIG. 5 ]
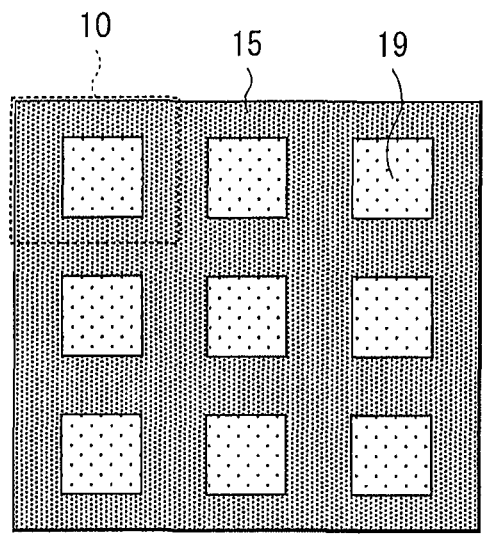
[ FIG. 6 ]
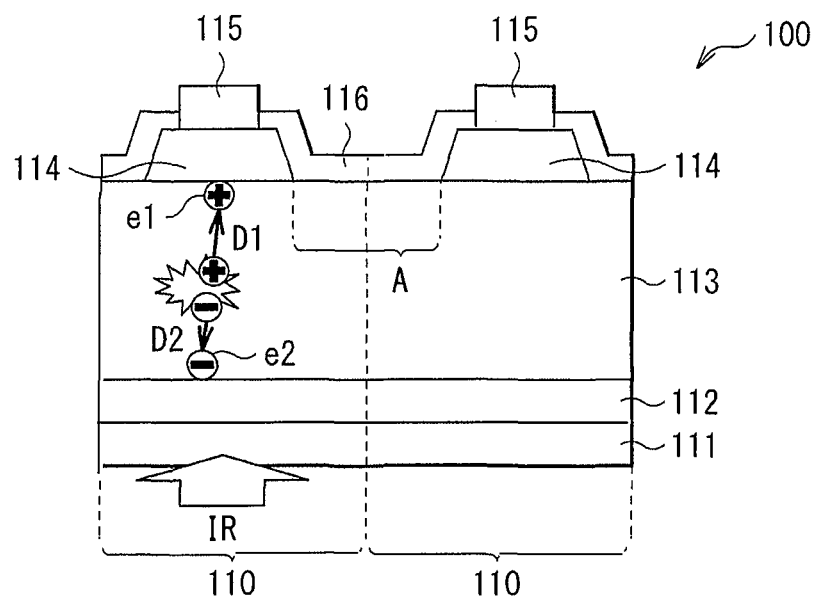

[ FIG. 7 ]
[ FIG. 8 ]
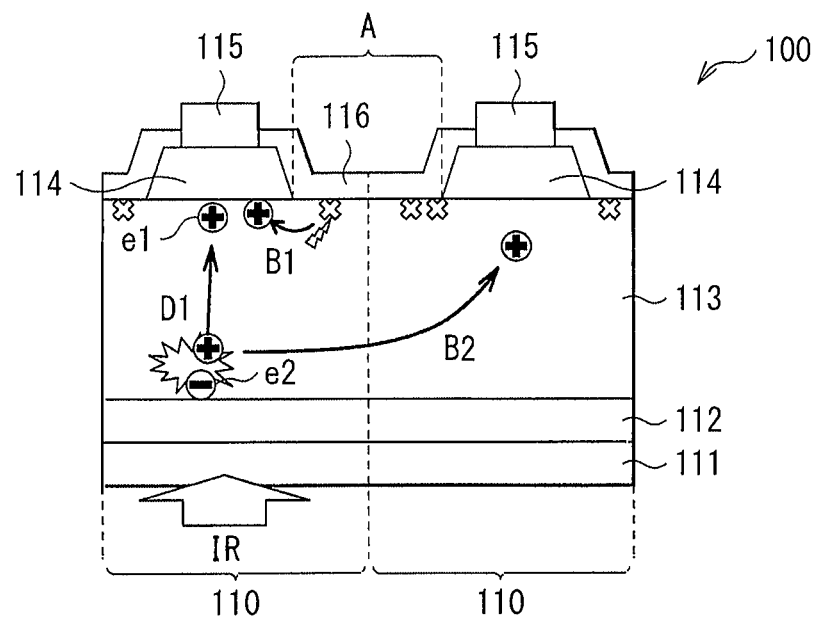

[ FIG. 9 ]
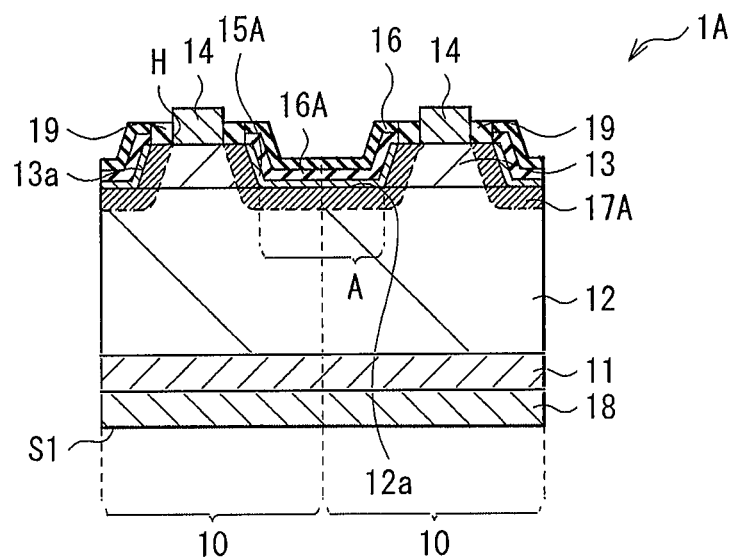
[ FIG. 10 ]
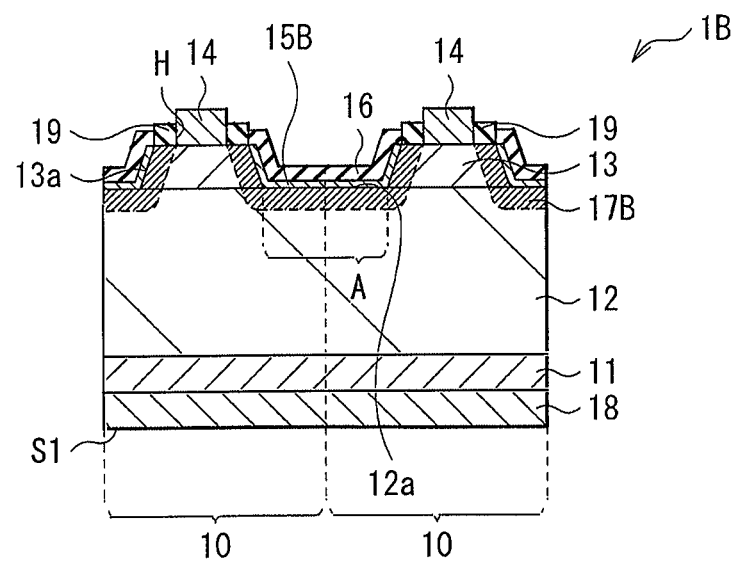

[ FIG. 11 ]
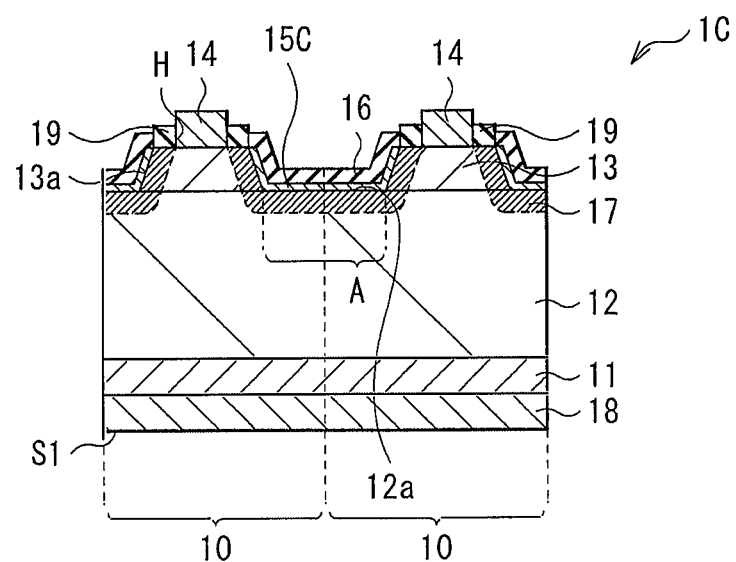
[ FIG. 12 ]
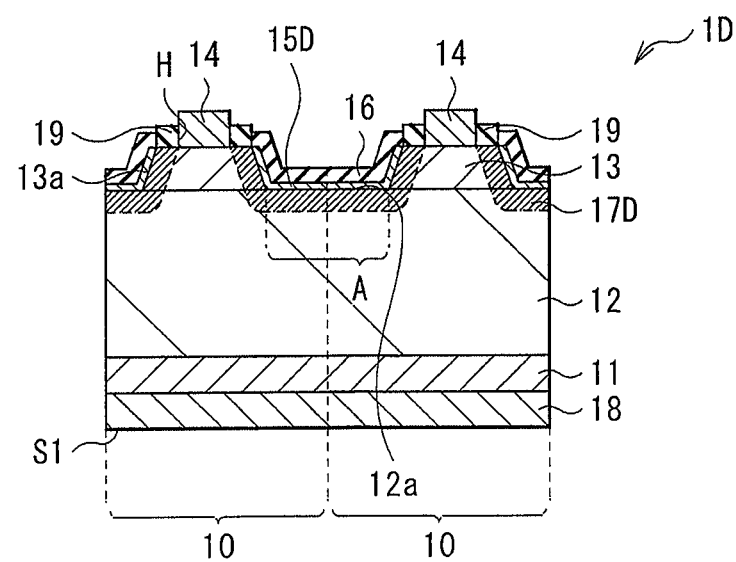

[ FIG. 13 ]
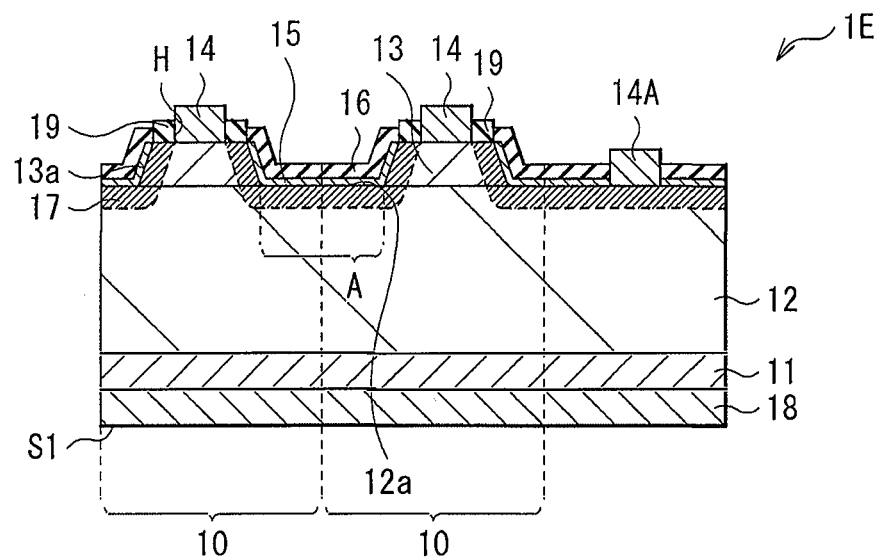
[ FIG. 14 ]
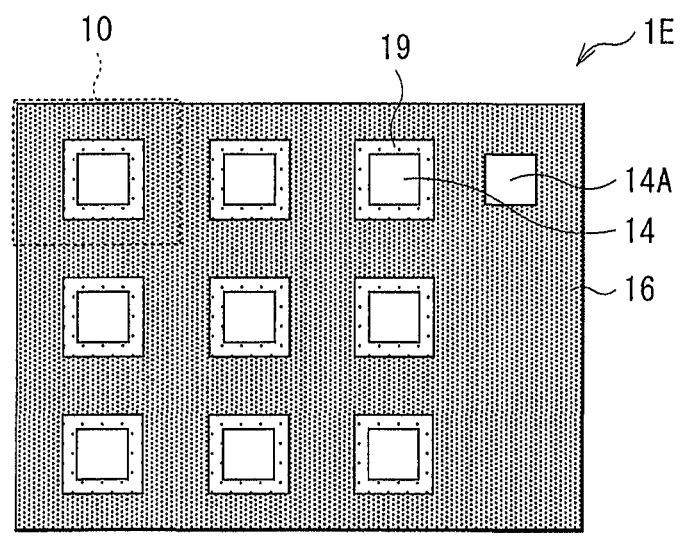

[ FIG. 15 ]
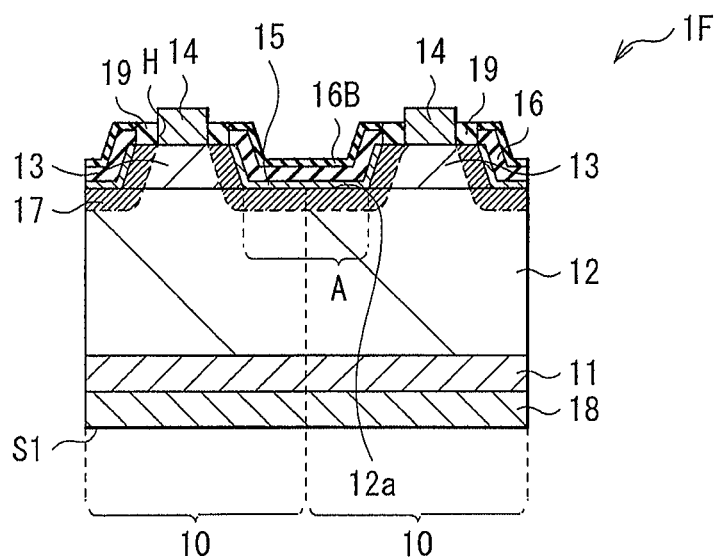

[ FIG. 16 ]
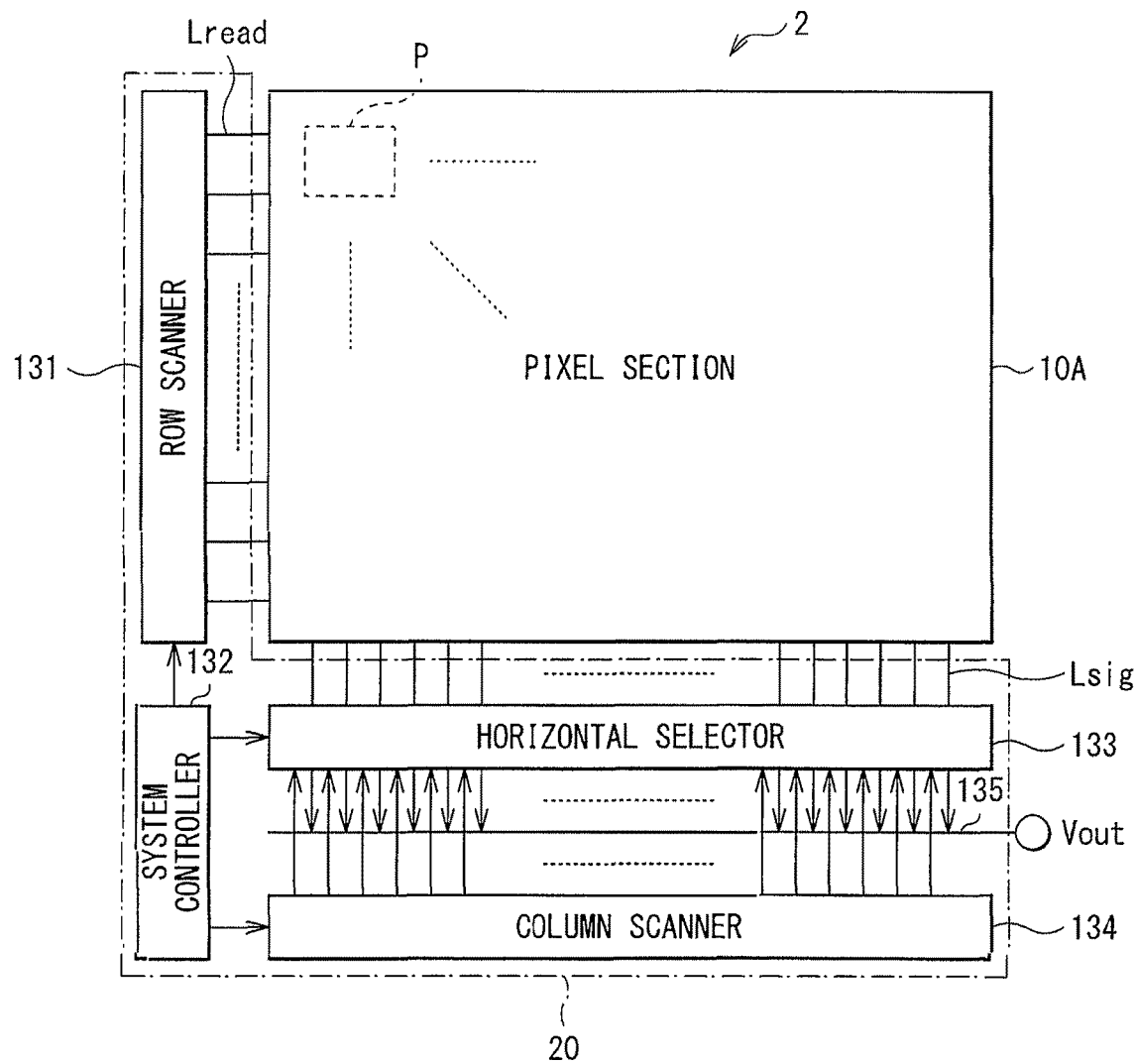
[ FIG. 17 ]
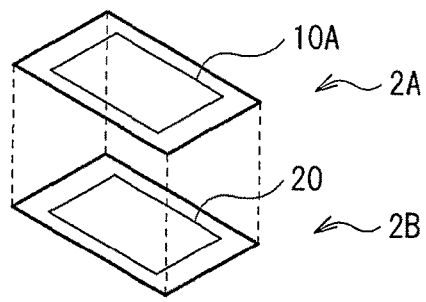

[ FIG. 18 ]
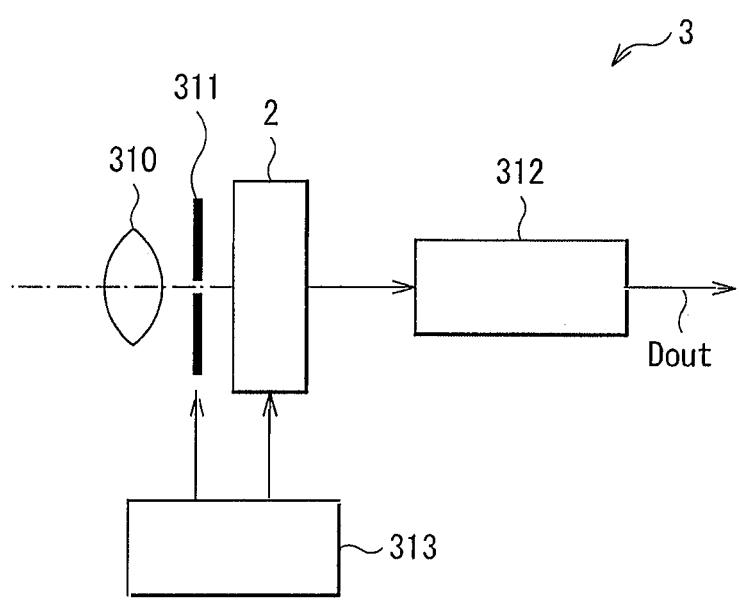

LIGHT RECEIVING DEVICE, METHOD OF MANUFACTURING LIGHT RECEIVING DEVICE, IMAGING DEVICE, AND ELECTRONIC APPARATUS

CROSS REFERENCE TO RELATED APPLICATIONS

This application is a divisional application of U.S. application Ser. No. 16/069,272 filed Jul. 11, 2018 which is a national stage application under 35 U.S.C. 371 and claims the benefit of PCT Application No. PCT/JP2016/083857 having an international filing date of Nov. 15, 2016, which designated the United States, which PCT application claimed the benefit of Japanese Patent Application No. 2016-008460 filed Jan. 20, 2016 the entire disclosures of each of which are incorporated herein by reference.

BACKGROUND ART

In recent years, research and development of an infrared sensor has been carried out for the purpose of monitoring, military applications, etc. As a light receiving device used for such an infrared sensor, a light receiving device is proposed that uses, for example, any of compound semiconductors (Group III-V semiconductors) such as InGaAs (indium gallium arsenide) in a photoelectric conversion layer (for example, see PTL 1).

CITATION LIST

Patent Literature

PTL 1: Japanese Unexamined Patent Application Publication No. 2014-127499

SUMMARY OF THE INVENTION

The light receiving device using the compound semiconductor as described above has a p-n junction or a pin junction, and generates electrons and holes in the photoelectric conversion layer through light irradiation. Reading of a change in a current or a voltage that is caused by such generation of the electrons and holes makes it possible to obtain signals, and a so-called semiconductor photodiode operation allows for photodetection. Further, InGaAs is formed, for example, through epitaxial growth on an InP substrate; however, InGaAs allows for detection of short-wavelength infrared light because bandgap energy thereof is smaller than that of silicon (Si)

To obtain images with use of such a structure of the light receiving device, a plurality of pixels including photodiodes are disposed to be laid all over in an array. To independently obtain a signal from each of these pixels, it is desirable that adjoining pixels (adjoining photodiodes) be electrically separated from one another.

A method of electrically separating the adjoining pixels from one another includes, for example, etching separation. In the above-described PTL 1, a p-type semiconductor layer is formed on the photoelectric conversion layer, and thereafter a region between the pixels (in the vicinity of a boundary between the pixels) in the p-type semiconductor layer is selectively removed by etching. Subsequently, each of the p-type semiconductor layers separated on each pixel basis is coupled to an electrode. In such a manner, an attempt is made to electrically separate the adjoining pixels from one another. Further, the region in the vicinity of the boundary between the pixels in a surface of the photoelectric conversion layer is covered with an insulating film including silicon nitride (SiN), silicon oxide ($SiO_2$), or the like.

However, the device structure in the above-described PTL 1 brings the surface of the photoelectric conversion layer and the insulating film into contact with each other in the region between the pixels. Here, an interface between a compound semiconductor and the insulating film is high in defect density, and therefore such an interface defect causes a dark current. The dark current becomes a noise component that is not a current generated by entry of light. Further, a larger noise leads to a smaller S/N ratio, resulting in reduction in a dynamic range of an obtained image as well. As described above, a method of suppressing degradation in image quality that is caused by generation of the dark current due to the interface defect is desired.

It is therefore desirable to provide a light receiving device, a method of manufacturing a light receiving device, an imaging device, and an electronic apparatus that allow for suppression of degradation in image quality.

A light receiving device according to an embodiment of the present disclosure includes: a photoelectric conversion layer that includes a first compound semiconductor, and absorbs a wavelength in an infrared region to generate electrical charges; a plurality of contact layers that include a second compound semiconductor, and are provided on the photoelectric conversion layer at spacing intervals with respect to one another; and a covering layer that is formed to cover a portion corresponding to the spacing intervals of a front surface of the photoelectric conversion layer and side surfaces of the respective contact layers, and includes a Group IV semiconductor.

A method of manufacturing a light receiving device according to an embodiment of the present disclosure includes: forming a photoelectric conversion layer that includes a first compound semiconductor, and absorbs a wavelength in an infrared region to generate electrical charges; forming a plurality of contact layers that include a second compound semiconductor, and are disposed on the photoelectric conversion layer at spacing intervals with respect to one another; and forming a covering layer including a Group IV semiconductor that covers a portion corresponding to the spacing intervals of a front surface of the photoelectric conversion layer and side surfaces of the respective contact layers.

In the light receiving device and the method of manufacturing the light receiving device according to the respective embodiments of the present disclosure, the plurality of contact layers including the second compound semiconductor are formed at the spacing intervals on the photoelectric conversion layer including the first compound semiconductor. In such a configuration, the covering layer including the Group IV semiconductor is formed to cover the portion corresponding to the spacing intervals of the front surface of the photoelectric conversion layer and the side surfaces of the respective contact layers. In other words, the portion corresponding to the spacing intervals between the contact layers of the photoelectric conversion layer comes in contact with the covering layer including the Group IV semiconductor. Here, in a case where the photoelectric conversion layer and an insulating film come in contact with each other, defect density becomes high at an interface therebetween. However, contacting between the photoelectric conversion layer and the covering layer makes interface defect density smaller as compared with a case of contacting with the insulating film. This suppresses generation of a dark current that is caused by an interface defect.

An imaging device according to an embodiment of the present disclosure includes: a plurality of pixels; a photoelectric conversion layer that includes a first compound semiconductor, and absorbs a wavelength in an infrared region to generate electrical charges; a plurality of contact layers that include a second compound semiconductor, and are provided on the photoelectric conversion layer at spacing intervals with respect to one another on a pixel basis; and a covering layer that is formed to cover a portion corresponding to the spacing intervals of a front surface of the photoelectric conversion layer and side surfaces of the respective contact layers, and includes a Group IV semiconductor.

An electronic apparatus according to an embodiment of the present disclosure includes the imaging device according to the above-described embodiment of the present disclosure.

According to the light receiving device, the method of manufacturing the light receiving device, the imaging device, and the electronic apparatus of the respective embodiments of the present disclosure, the plurality of contact layers are provided at the spacing intervals on the photoelectric conversion layer including the first compound semiconductor, and the covering layer including the Group IV semiconductor is formed to cover the portion corresponding to the spacing intervals of the front surface of the photoelectric conversion layer and the side surfaces of the respective contact layers. This makes it possible to reduce interface defect density of the photoelectric conversion layer, and to suppress generation of the dark current. As a result, this allows for suppression of degradation in image quality.

It is to be noted that above descriptions are merely exemplified. The effects of the present disclosure are not limited to the effects described above, and may be other different effects, or may further include other effects.

BRIEF DESCRIPTION OF DRAWINGS

FIG. 1 is a cross-sectional view of a configuration of a light receiving device according to an embodiment of the present disclosure.

FIG. 2 is a schematic view of a planar configuration of the light receiving device illustrated in FIG. 1.

FIG. 3A is a cross-sectional view for description of a process of a method of manufacturing the light receiving device illustrated in FIG. 1.

FIG. 3B is a cross-sectional view of a process following the process illustrated in FIG. 3A.

FIG. 3C is a cross-sectional view of a process following the process illustrated in FIG. 3B.

FIG. 4A is a cross-sectional view for description of a process of a method of manufacturing the light receiving device illustrated in FIG. 3B.

FIG. 4B is a cross-sectional view of a process following the process illustrated in FIG. 4A.

FIG. 4C is a cross-sectional view of a process following the process illustrated in FIG. 4B.

FIG. 5 is a plan view of the process illustrated in FIG. 4A.

FIG. 6 is a schematic view for description of photoelectric conversion operation of a light receiving device according to a comparative example.

FIG. 7 is a schematic view for description of workings of the light receiving device according to the comparative example.

FIG. 8 is a schematic view for description of workings of the light receiving device illustrated in FIG. 1.

FIG. 9 is a cross-sectional view of a configuration of a light receiving device according to a modification example 1.

FIG. 10 is a cross-sectional view of a configuration of a light receiving device according to a modification example 2.

FIG. 11 is a cross-sectional view of a configuration of a light receiving device according to a modification example 3.

FIG. 12 is a cross-sectional view of a configuration of a light receiving device according to a modification example 4.

FIG. 13 is a cross-sectional view of a configuration of a light receiving device according to a modification example 5.

FIG. 14 is a schematic view of a planar configuration of the light receiving device illustrated in FIG. 13.

FIG. 15 is a cross-sectional view of a configuration of a light receiving device according to a modification example 6.

FIG. 16 is a block diagram illustrating a configuration of an imaging device.

FIG. 17 is a schematic view of a configuration example of a stack-type imaging device.

FIG. 18 is a functional block diagram illustrating an example of an electronic apparatus (a camera) using the imaging device illustrated in FIG. 16.

MODES FOR CARRYING OUT THE INVENTION

Hereinafter, embodiments of the present disclosure are described in detail with reference to the drawings. It is to be noted that description is given in the following order.
1. Embodiment (an example of a light receiving device including a covering layer that covers a surface of a photoelectric conversion layer and side surfaces of contact layers, and includes a Group IV semiconductor (Si))
2. Modification Example 1 (an example of the light receiving device including the covering layer including another Group IV semiconductor (Ge))
3. Modification Example 3 (an example of the light receiving device including the covering layer including another Group IV semiconductor (SiGe))
4. Modification Example 4 (an example of the light receiving device including the covering layer including n-type Si)
5. Modification Example 5 (an example of the light receiving device including the covering layer that includes an impurity element functioning as an n type in the photoelectric conversion layer)
6. Modification Example 6 (an example of the light receiving device including an electrode that serves to perform potential control of a diffusion region of the photoelectric conversion layer)
7. Modification Example 7 (an example of the light receiving device including an insulating film that includes a fixed charge on the covering layer)
8. Application Example 1 (an example of an imaging device)
9. Application Example 2 (an example of an electronic apparatus)

EMBODIMENT

[Configuration]

FIG. 1 illustrates a cross-sectional configuration of a light receiving device (a light receiving device 1) according to an embodiment of the present disclosure. FIG. 2 illustrates a planar configuration of the light receiving device 1 in a schematic manner. The light receiving device 1 is applicable to, for example, an infrared sensor, etc. using a compound semiconductor, and includes pixels 10 (corresponding to pixels P of an imaging device as described later) serving as a plurality of light receiving unit regions that are disposed two-dimensionally, for example. It is to be noted that FIG. 1 illustrates the cross-sectional configuration of a portion corresponding to two pixels P.

The light receiving device 1 includes, for example, a photoelectric conversion layer 12 and a plurality of contact layers 13 in this order on a substrate 11. An electrode (a first electrode 14) is electrically coupled to each of the plurality of contact layers 13. A covering layer 15 and an insulating film 16 (a first insulating film) are formed in this order to cover a portion (a surface 12a) of a front surface of the photoelectric conversion layer 12 and a side surface (a side surface 13a) of each of the contact layers 13. A diffusion region 17 including an impurity is formed in a region adjacent to the covering layer 15 of the photoelectric conversion layer 12 and the contact layers 13. For example, a second electrode 18 is formed on a surface on a side opposite to the photoelectric conversion layer 12 of the substrate 11. In the light receiving device 1, for example, a rear surface of the second electrode 18 serves as a light entrance surface S1 (configuration is made to allow infrared light IR to enter the rear surface from a side on which the second electrode 18 is located). Hereinafter, description is provided on a configuration of each of components.

It is to be noted that an on-chip lens, etc., (not illustrated) may be further provided on a side on which the light entrance surface S1 is located of the second electrode 18. Further, in a case where not only infrared light but also visible light is detected, a color filter may be provided. In addition, a silicon semiconductor substrate is stacked on the insulating film 16 and the first electrode 14. In the silicon semiconductor substrate, a pixel circuit used to read signals from the respective pixels 10, and a variety of wiring patterns, etc are formed. The first electrode 14 and the second electrode 18 are electrically coupled to various circuits formed on the silicon semiconductor substrate through, for example, a bump, a via hole, etc.

The substrate 11 includes a compound semiconductor including an n-type impurity, for example. An example of the compound semiconductor used for the substrate 11 includes any of Group III-V semiconductors such as InP. Here, the photoelectric conversion layer 12 is formed on the substrate 11 in contact with the substrate 11; however, another layer may be interposed between the substrate 11 and the photoelectric conversion layer 12. Examples of a material of the layer that is interposed between the substrate 11 and the photoelectric conversion layer 12 include a semiconductor material such as InAlAs, Ge, Si, GaAs, or InP. However, it is desirable to select a material that is lattice-matched between the substrate 11 and the photoelectric conversion layer 12.

The photoelectric conversion layer 12 includes a compound semiconductor that absorbs, for example, a wavelength in an infrared region (hereinafter referred to as infrared light) to generate electrical charges (electrons and holes). Here, the photoelectric conversion layer 12 is provided continuously on the substrate 11 as a layer that is common to the plurality of pixels 10 (or the plurality of contact layers 13).

The photoelectric conversion layer 12 includes, for example, an n-type or p-type compound semiconductor (a first compound semiconductor). An example of the compound semiconductor used for the photoelectric conversion layer 12 includes any of the Group III-V semiconductors such as InGaAs. As an example, a composition of the compound semiconductor for the photoelectric conversion layer 12 that is lattice-matched to the substrate 11 including InP is $In_{0.53}Ga_{0.47}As$. It is desirable that doping density in a case of the photoelectric conversion layer 12 is of an n type be, for example, $1.0\times10^{18}$ cm$^{-3}$ or less, and doping density in a case where the photoelectric conversion layer 12 is of a p type be, for example, $1.0\times10^{16}$ cm$^{-3}$ or less. Examples of an n-type impurity include silicon (Si), etc., and example of a p-type impurity include zinc (Zn), etc.

The contact layer 13 includes, for example, a p-type compound semiconductor (a second compound semiconductor). An example of the compound semiconductor used for the contact layer 13 includes any of Group III-V semiconductors such as InP. The plurality of contact layers 13 are disposed on the photoelectric conversion layer 12 at spacing intervals (spacing intervals A) with respect to one another (away from one another). Each of the contact layers 13 is formed in an island shape for each of the pixels 10. The plurality of contact layers 13 are formed, for example, by removing selective portions corresponding to the spacing intervals A through etching (through etching separation) in a manufacturing process.

It is to be noted that the Group III-V semiconductors used for the photoelectric conversion layer 12 and the contact layers 13 are not limited to the above-described materials (InGaAs and InP). For example, it is possible to use compound semiconductors including one or more kinds of indium (In), gallium (Ga), aluminum (Al), arsenic (As), phosphorus (P), antimony (Sb), nitrogen (N), etc. for the photoelectric conversion layer 12 and the contact layers 13. Examples of the materials other than InGaAs and InP include InGaAsP, InGaP, InAsSb, GaAsSb, InAlAs, etc. Alternatively, not only the above-described Group III-V semiconductors but also compound semiconductors such as Group II-VI semiconductors, for example, may be used for the photoelectric conversion layer 12 and the contact layers 13. Further, an intrinsic semiconductor may be also used for the photoelectric conversion layer 12.

The substrate 11, the photoelectric conversion layer 12, and the contact layers 13 are stacked, thereby forming a p-n junction or a pin junction for each of the pixels 10 in the light receiving device 1.

The first electrode 14 is an electrode to which a voltage for reading of electric charges (for example, holes) generated in the photoelectric conversion layer 12 is supplied, and is provided for each of the pixels 10. Here, a mask layer 19 having, for example, an opening H is provided on the contact layer 13, and the first electrode 14 is electrically coupled to the contact layer 13 through the opening H of the mask layer 19. An example of a constituent material for the first electrode 14 includes a simple substance of any of titanium (Ti), tungsten (W), titanium nitride (TiN), platinum (Pt), gold (Au), germanium (Ge), nickel (Ni), and aluminum (Al), or an alloy including one or more kinds of the these materials. Alternatively, the first electrode 14 may include a transparent conductive film such as ITO (indium tin oxide), for example. The first electrode 14 corresponds to a specific example of an "electrode" in the present disclosure.

The covering layer 15 is formed to cover the surface 12a corresponding to the spacing interval A of the front surface of the photoelectric conversion layer 12, and the side surface 13a of each of the contact layers 13. The covering layer 15 includes a Group IV semiconductor (a simple substance or a compound of a Group IV element). In the present embodiment, the covering layer 15 includes, for example, silicon (Si) (as a major constituent). As seen from a plan view, the covering layer 15 desirably covers a whole area except for the first electrode 14 and the mask layer 19. A thickness of the covering layer 15 is, for example, from 0.25 nm to 100 nm both inclusive, and desirably a thickness from 1 nm to 10 nm both inclusive. The thickness of 1 nm or more facilitates to ensure favorable coverage. Poor coverage may cause a dark current; however, the thickness of 1 nm or more makes it possible to suppress generation of the dark current that is caused by such coverage. Further, current leakage may arise between adjoining contact layers 13 through the covering layer 15. However, if the covering layer 15 has a thickness of 10 nm or less, it is possible to suppress occurrence of such current leakage.

The insulating film 16 functions as a protective film of the light receiving device 1, and is an insulating film that includes any of silicon, nitrogen (N), aluminum (Al), hafnium (Hf), etc., for example. Specifically, the insulating film 16 includes silicon oxide ($SiO_2$). In addition to this, however, the insulating film 16 may include, for example, silicon nitride (SiN), silicon oxynitride (SiON), aluminum oxynitride (AlON), STAIN, aluminum oxide ($Al_2O_3$), AlSiO, hafnium oxide ($HfO_2$), HfAlO, or the like. The insulating film 16 may be either a single-layer film or a laminated film.

The diffusion region 17 is formed in a portion (a portion adjacent to the covering layer 15) of the photoelectric conversion layer 12 and the contact layers 13. The diffusion region 17 is a region in which an element included in the covering layer 15 is diffused in a portion of the photoelectric conversion layer 12 or the contact layers 13. For example, in a case where the covering layer 15 is a film including Si, Si is diffused in the diffusion region 17 (the diffusion region 17 includes silicon). An element (for example, Si) included in the covering layer 15 is diffused into each of the photoelectric conversion layer 12 and the contact layers 13 in a manufacturing process (through performing an annealing treatment after film formation of the covering layer 15 as will hereinafter be described in detail), which makes it possible to form the diffusion region 17. The diffusion region 17 becomes a region that is higher in doping density than a surrounding region in the photoelectric conversion layer 12.

The second electrode 18 is provided on a rear surface (the light entrance surface S1) of the substrate 11 as an electrode common to the respective pixels P, for example. It is to be noted that, in a case where, for example, holes of electrical charges generated in the photoelectric conversion layer 12 are read out as signal charges through the first electrode 14, it is possible to discharge, for example, electrons through the second electrode 18. Further, as long as the second electrode 18 is electrically coupled to the substrate 11, the second electrode 18 may not be necessarily formed over the whole rear surface of the substrate 11. Alternatively, the second electrode 18 may not be provided.

The second electrode 18 includes a conductive film having transmittance of 50% or more for light having a wavelength of at least 1.6 μm, for example.

The mask layer 19 is a hard mask or a resist mask that includes an insulating material. In a case of the hard mask, the mask layer 19 is, for example, an insulating film including any of silicon, nitride (N), aluminum (Al), hafnium (Hf), etc, for example. Examples of the material include silicon oxide ($SiO_2$), silicon nitride (SiN), silicon oxynitride (SiON), aluminum oxynitride (AlON), STAIN, aluminum oxide ($Al_2O_3$), AlSiO, hafnium oxide ($HfO_2$), HfAlO, etc.

[Manufacturing Method]

It is possible to manufacture the light receiving device 1 in the following manner, for example. FIGS. 3A to 4C illustrate manufacturing processes of a major part of the light receiving device 1 in order corresponding to the processes.

First, as illustrated in FIG. 3A, the photoelectric conversion layer 12 including, for example, n-type (or p-type) InGaAs, and a contact layer 13b including, for example, p-type InP are epitaxially grown on one surface of the substrate 11 including, for example, n-type InP in sequence. In a growth process of InGaAs, gas, etc. containing, for example, an n-type (or p-type) impurity is introduced, thereby forming the photoelectric conversion layer 12 as an n-type (or p-type) layer. In a growth process of InP, gas, etc. containing, for example, a p-type impurity is introduced, thereby, forming the contact layer 13b as a p-type layer.

Next, as illustrated in FIG. 3B, the mask layer 19 including any of the above-described materials (for example, SiN) is formed on the contact layer 13b for each of the pixels 10.

Thereafter, as illustrated in FIG. 3C, selective regions (regions in the vicinity of a boundary between the pixels 10) of the contact layer 13b are removed by, for example, dry etching or wet etching to form the spacing intervals A (the contact layer 13b is subjected to etching separation). In other words, the plurality of contact layers 13 are formed at the spacing intervals A with respect to one another.

Next, the covering layer 15 is formed, as illustrated in FIG. 4A. Specifically, a film including the above-described Group IV semiconductor (for example, Si) is formed using a method such as sputtering deposition, electron beam deposition, resistive heating deposition, CVD (Chemical Vapor Deposition), or ALD (Atomic Layer Deposition), for example, which is followed by patterning. At this time, the covering layer 15 is formed to cover the surface 12a exposed from the contact layers 13 of the front surface of the photoelectric conversion layer 12, and the side surfaces 13a of the contact layers 13.

FIG. 5 illustrates a planar configuration of the covering layer 15 after formation thereof in a schematic manner. As illustrated in FIG. 5, as seen from a plan view, the covering layer 15 is desirably formed to cover the whole region excluding the mask layer 19 in the plurality of pixels 10.

Next, the insulating film 16 is formed on the covering layer 15, as illustrated in FIG. 4B. Specifically, the insulating film 16 including the above-described insulating material (for example, $SiO_2$) is formed using a method such as thermal oxidation, CVD or ALD, for example, which is followed by the patterning.

Thereafter, the diffusion region 17 is formed, as illustrated in FIG. 4C. Specifically, the annealing treatment is carried out. Desirably, an annealing temperature at this time is set to a temperature at which a Group IV semiconductor atom included in the covering layer 15 is activated as a dopant. In activating an Si atom included in the covering layer 15, it is possible to set the annealing temperature to at least 400 degrees centigrade but no more than 800 degrees centigrade. This makes it possible to diffuse the Group IV semiconductor atom (for example, the Si atom) included in the covering layer 15 into the photoelectric conversion layer 12 and the contact layers 13 that are located adjacently. In such a manner, the diffusion region 17 including, for example, Si as an impurity is formed. The diffusion region 17 becomes a region (here, an n-type region) that is higher in doping density than a surrounding region thereof in the photoelectric conversion layer 12, and forms a potential barrier in a region corresponding to the spacing interval A (a region in the vicinity of a boundary between the pixels 10) in the photoelectric conversion layer 12.

It is to be noted that herein, the annealing treatment is performed after forming the insulating film 16 to diffuse the Group IV semiconductor atom from the covering layer 15, thereby forming the diffusion region 17. However, a timing of forming the diffusion region 17 is not limited thereto, and the diffusion region 17 may be formed at any time after forming the covering layer 15. For example, in a case where the insulating film 16 is formed using thermal oxidation, etc., it is possible to diffuse the Group IV semiconductor atom at a film-formation temperature. As described above, it is also possible to form the diffusion region 17 at the same time as formation of the insulating film 16.

Subsequently, the first electrode 14 and the second electrode 18 each of which includes the above-described material are formed, and it is to be noted that, in forming the first electrode 14, the opening H is formed in the mask layer 19, and thereafter the first electrode 14 is so formed as to come in contact with the contact layer 13 through the opening H. The processes described thus far bring the light receiving device 1 illustrated in FIG. 1 to completion.

[Workings and Effects]

In the light receiving device 1 of the present embodiment, in a case where the infrared light IR enters the photoelectric conversion layer 12 through the second electrode 18 and the substrate 11, the infrared light IR is absorbed in the photoelectric conversion layer 12. As a result, pairs of holes and electrons are generated in the photoelectric conversion layer 12 (the infrared light IR is subjected to photoelectric conversion). At this time, for example, a predetermined voltage is applied to the photoelectric conversion layer 12 through the first electrode 14 and the second electrode 18 (a potential gradient is formed), which causes one electrical charge (here, the hole) of the generated electrical charges to be collected as a signal charge toward a side on which the first electrode 14 is located. Such a signal charge is read out by an unillustrated pixel circuit through the first electrode 14.

It is to be noted that, in a case where the second electrode 18 is not provided, a voltage may be applied to the first electrode 14 to form a potential gradient between the first electrode 14 and the substrate 11. However, providing the second electrode 18 facilitates to form a greater potential gradient, and makes it possible to eliminate the other electrical charge (here, the electron) of the electrical charges generated by the photoelectric conversion from the photoelectric conversion layer 12 through the second electrode 18.

Here, in the light receiving device 1, the plurality of contact layers 13 are disposed on the photoelectric conversion layer 12 at the spacing intervals A with respect to one another. The spacing intervals A between the plurality of contact layers 13 are formed by etching.

FIG. 6 illustrates a cross-sectional configuration of a light receiving device (a light receiving device 100) according to a comparative example of the present embodiment. As with the light receiving device 1 of the present embodiment, also in the light receiving device 100 according to the present comparative example, an n-type photoelectric conversion layer 113 and a p-type contact layer 114 each of which includes a compound semiconductor are formed in this order on a substrate 112. On the photoelectric conversion layer 113, a plurality of contact layers 114 are formed to be separated (at the spacing intervals A) through etching. A first electrode 115 is formed on the contact layer 114, and a second electrode 111 is formed on a surface on the light entrance side of the substrate 112. In such a configuration, an insulating film 116 including SiN is formed to cover portions corresponding to the spacing intervals A of a front surface of the photoelectric conversion layer 113, and side surfaces of the contact layers 114. In the light receiving device 100, a hole e1 and an electron e2 is generated in the photoelectric conversion layer 113 by entry of the infrared light IR, and the hole e1 migrates toward a side on which the first electrode 115 is located (D1), while the electron e2 migrates toward a side on which the second electrode 111 is located (D2).

However, the light receiving device 100 of the comparative example adopts a structure in which the photoelectric conversion layer 113 and the insulating film 116 come in contact with each other at the spacing interval A between the contact layers 114 (in a region in the vicinity of a boundary between pixels 110). Here, as illustrated in FIG. 7 in a schematic manner, an interface between a compound semiconductor and the insulating film is high in the defect density; therefore such an interface defect causes a dark current (B1) to be generated. The dark current becomes a noise component that is not a current generated by entry of light. Further, a larger noise leads to a smaller S/N ratio, resulting in reduction in a dynamic range of an obtained image as well. As described above, the dark current is generated due to the interface defect, resulting in degradation in image quality.

Further, in the light receiving device 100 of the comparative example, the respective first electrodes 115 are electrically separated in the adjoining pixels 110; however, the hole e1 and the electron e2 that are generated in the photoelectric conversion layer 113 flow into the neighboring pixel 110 in some cases. Consequently, the hole e1 generated by the photoelectric conversion in the single pixel 110 flows into the neighboring pixel 110 (B2), and is read out as a signal of the neighboring pixel 110 through the contact layer 114. As a result, signal crosstalk occurs between the adjoining pixels 110.

It is to be noted that, in a light receiving device using silicon, inter-pixel separation with use of, for example, ion implantation is mostly carried out to prevent the above-described signal crosstalk between pixels. However, a compound semiconductor is a crystal having ion binding property, and a crystalline structure thereof is more vulnerable than the Group IV semiconductor, resulting in being significantly damaged by the ion implantation, and being unlikely to recover from the damage. Therefore, a light receiving device using the compound semiconductor has difficulty in achieving separation with use of the ion implantation. Further, apart from the ion implantation, the light receiving device using silicon makes it possible to form a structure that performs device separation in such a manner that, for example, a trench is formed to bury an insulating film into the trench, that is, a so-called STI (Shallow Trench Isolation) structure. However, the light receiving device using the compound semiconductor has difficulty in forming the STI structure, because the dark current generated due to the interface defect between the compound semiconductor and the insulating film becomes greater.

In contrast, in the light receiving device 1 of the present embodiment, in a configuration where the plurality of contact layers 13 are disposed on the photoelectric conversion layer 12 including the compound semiconductor at the spacing intervals A with respect to one another (in a configuration where the contact layer 13 is separated by etching), the covering layer 15 including the Group IV semiconductor (for example, Si) is formed to cover the portion (the surface 12a) corresponding to the spacing interval A of the front surface of the photoelectric conversion layer 12, and the side surface 13a of each of the contact layers 13. In other words, the surface 12a corresponding to the spacing interval A of the front surface of the photoelectric conversion layer 12 comes in contact with the covering layer 15, not the insulating film 16. At the interface between the photoelectric conversion layer 12 and the covering layer 15, the defect density becomes lower in comparison with a case of contacting with the insulating film 16. This suppresses generation of the dark current that is caused by the interface defect.

Meanwhile, in the light receiving device 1, the covering layer 15 is interposed between the insulating film 16 and both the photoelectric conversion layer 12 and the contact layer 13; therefore a laminated film including the covering layer 15 and the insulating film 16 increases an effective insulating film thickness. However, in the light receiving device 1, the covering layer 15 and the insulating film 16 are formed to cover the surface 12a of the photoelectric conversion layer 12 and the side surfaces 13a of the contact layers 13. In other words, the above-described laminated film is not interposed between the contact layer 13 and the first electrode 14 (electric-field control through the laminated film is not performed), and thus an increase in the effective film thickness has no issues.

Further, in the light receiving device 1 of the present embodiment, the diffusion region 17 is formed in a portion adjacent to the covering layer 15 of the photoelectric conversion layer 12 and the contact layers 13. In other words, the Group IV semiconductor element that is included in the covering layer 15 by the annealing treatment after formation of the covering layer 15 is diffused in the photoelectric conversion layer 12 and the contact layers 13. The Group IV semiconductor functions as a donor for the Group III-V semiconductors; therefore, the Group IV semiconductor atom diffused from the surface 12a of the photoelectric conversion layer 12 becomes an n-type dopant in the photoelectric conversion layer 12. As a result, the diffusion region 17 becomes an n+ region that is higher in doping density than a surrounding region thereof in the photoelectric conversion layer 12, leading to enhancement of a p-n junction in a region (a region 21) in the vicinity of a boundary between the pixels 10 (for example, a p+n junction turns to a p+n+ junction). In other words, a configuration is achieved that facilitates to electrically separate the adjoining pixels 10 from each other. Further, the high-density n-type region is formed in the vicinity of the surface 12a of the photoelectric conversion layer 12, which forms a built-in potential barrier E against the hole e1, as illustrated in FIG. 8 in a schematic manner. This makes it possible to suppress occurrence of the signal crosstalk between the adjoining pixels 10 and suppress degradation in image quality.

As described above, in the present embodiment, the plurality of contact layers 13 are provided on the photoelectric conversion layer 12 including the compound semiconductor at the spacing intervals A with respect to one another, and the first electrode 14 is electrically coupled to each of the contact layer 13. The covering layer 15 including the Group IV semiconductor (Si) is formed to cover the portion (the surface 12a) corresponding to the spacing interval A of the front surface of the photoelectric conversion layer 12, and the side surface 13a of each of the contact layers 13. This makes it possible to reduce the interface defect density at the interface between the photoelectric conversion layer 12 and the covering layer 15, as compared with an interface in a case where the photoelectric conversion layer 12 and the insulating film 16 come in contact with each other, thereby suppressing generation of the dark current. This allows for suppression of degradation in image quality.

Next, the description is provided on modification examples of the above-described embodiment. Hereinafter, any components essentially same as those in the above-described embodiment are denoted with the same reference numerals, and the related descriptions are omitted as appropriate.

Modification Example 1

FIG. 9 illustrates a cross-sectional configuration of a light receiving device (a light receiving device 1A) according to a modification example 1. As with the above-described embodiment, the light receiving device 1A includes, for example, the photoelectric conversion layer 12 and the plurality of contact layers 13 in this order on the substrate 11, and the plurality of contact layers 13 are provided on the photoelectric conversion layer 12 at the spacing intervals A with respect to one another. The first electrode 14 is electrically coupled to each of the plurality of contact layers 13 through the opening H of the mask layer 19. A covering layer (a covering layer 15A) and insulating films (insulating films 16A and 16) are formed in this order to cover a portion (the surface 12a) of the front surface of the photoelectric conversion layer 12 and the side surface 13a of each of the contact layers 13. A diffusion region (a diffusion region 17A) including an impurity is formed in a region adjacent to the covering layer 15A of the photoelectric conversion layer 12 and the contact layers 13. For example, the second electrode 18 is formed on the surface on the side opposite to the photoelectric conversion layer 12 of the substrate 11. In the light receiving device 1, for example, the rear surface of the second electrode 18 serves as the light entrance surface S1.

In the present modification example, however, the covering layer 15A includes germanium (Ge) as a Group IV semiconductor element. Further, for the insulating film 16A that is formed on the covering layer 15A, a constituent material similar to that for the insulating film 16 of the above-described embodiment may be used; however, it is desirable to use germanium oxide ($GeO_2$). The insulating film 16A includes germanium oxide, which causes a superior interface property between the insulating film 16A and the covering layer 15A including Ge. Providing the insulating film 16 on the insulating film 16A allows for suppression of deterioration in the insulating film 16A.

Further, by the annealing treatment as described above, Ge included in the covering layer 15A is diffused into a portion of the photoelectric conversion layer 12 and the contact layers 13, leading to formation of the diffusion region 17A. Therefore, the diffusion region 17A includes Ge as an n-type dopant in the photoelectric conversion layer 12, and forms a high-density n-type region.

In the light receiving device 1A of the present modification example as well, the covering layer 15A including the Group IV semiconductor element (Ge) comes in contact with the surface 12a of the photoelectric conversion layer 12, which reduces the interface defect density as compared with a case of contacting with the insulating film. Further, a potential barrier is formed in the photoelectric conversion layer 12 by the diffusion region 17A. This makes it possible to obtain effects similar o those achieved in the above-described embodiment.

Modification Example 2

FIG. 10 illustrates a cross-sectional configuration of a light receiving device (a light receiving device 1B) according to a modification example 2. As with the above-described embodiment, the light receiving device 1B includes, for example, the photoelectric conversion layer 12 and the plurality of contact layers 13 in this order on the substrate 11, and the plurality of contact layers 13 are provided on the photoelectric conversion layer 12 at the spacing intervals A with respect to one another. The first electrode 14 is electrically coupled to each of the plurality of contact layers 13 through the opening H of the mask layer 19. A covering layer (a covering layer 15B) and the insulating film 16 are formed in this order to cover a portion (the surface 12a) of the front surface of the photoelectric conversion layer 12 and the side surface 13a of each of the contact layers 13. A diffusion region (a diffusion region 17B) including an impurity is formed in a region adjacent to the covering layer 15B of the photoelectric conversion layer 12 and the contact layers 13. For example, the second electrode 18 is formed on the surface on the side opposite to the photoelectric conversion layer 12 of the substrate 11. In the light receiving device 1, for example, the rear surface of the second electrode 18 serves as the light entrance surface S1.

In the present modification example, however, the covering layer 15B includes silicon germanium (SiGe) as the Group IV semiconductor. Further, by the annealing treatment as described above, Si and Ge included in the covering layer 15B are diffused into a portion of the photoelectric conversion layer 12 and the contact layers 13, leading to formation of the diffusion region 17B. Therefore, the diffusion region 17B includes Si and Ge as n-type dopants in the photoelectric conversion layer 12, and forms a high-density n-type region.

In the light receiving device 1B of the present modification example as well, the covering layer 15B including the Group IV semiconductor (SiGe) comes in contact with the surface 12a of the photoelectric conversion layer 12, which reduces the interface defect density as compared with a case of contacting with the insulating film. Further, a potential barrier is formed in the photoelectric conversion layer 12 by the diffusion region 17B. This makes it possible to obtain effects similar to those achieved in the above-described embodiment.

Further, SiGe has a lattice constant closer to that of the compound semiconductor (InP and InGaAs) in comparison with Si, which makes it possible to further reduce the defect of the interface with the compound semiconductor.

Modification Example 3

FIG. 11 illustrates a cross-sectional configuration of a light receiving device (a light receiving device 1C) according to a modification example 3. As with the above-described embodiment, the light receiving device 1C includes, for example, the photoelectric conversion layer 12 and the plurality of contact layers 13 in this order on the substrate 11, and the plurality of contact layers 13 are provided on the photoelectric conversion layer 12 at the spacing intervals A with respect to one another. The first electrode 14 is electrically coupled to each of the plurality of contact layers 13 through the opening H of the mask layer 19. A covering layer (a covering layer 15C) and the insulating film 16 are formed in this order to cover a portion (the surface 12a) of the front surface of the photoelectric conversion layer 12 and the side surface 13a of each of the contact layers 13. The diffusion region 17 is formed in a region adjacent to the covering layer 15C of the photoelectric conversion layer 12 and the contact layers 13, and Si included in the covering layer 15C is diffused in the diffusion region 17. For example, the second electrode 18 is formed on the surface on the side opposite to the photoelectric conversion layer 12 of the substrate 11. In the light receiving device 1, for example, the rear surface of the second electrode 18 serves as the light entrance surface S1.

In the present modification example, however, the covering layer 15C includes an n-type Group IV semiconductor (includes a Group IV semiconductor, and an element functioning as an n-type dopant for the Group IV semiconductor). For example, the covering layer 15C includes n-type Si (includes Si, and an element functioning as an n-type dopant for Si). Examples of the element serving as the n-type dopant for Si include arsenic (As), phosphorus (P), etc.

In the light receiving device 1C of the present modification example as well, the covering layer 15C including the Group IV semiconductor (n-type Si) comes in contact with the surface 12a of the photoelectric conversion layer 12, which reduces the interface defect density as compared with a case of contacting with the insulating film. Further, a potential barrier is formed in the photoelectric conversion layer 12 by the diffusion region 17. This makes it possible to obtain effects similar to those achieved in the above-described embodiment.

Further, the covering layer 15C includes the n-type dopant, which raises electron density in the Group IV semiconductor that comes in contact with the insulating film 16. Here, higher electron density ensures a smaller probability of recombination of interface formation with the insulating film 16, leading to improvement of the effect of reducing the dark current. In addition, a region in the vicinity of the interface between the Group IV semiconductor and the compound semiconductor is enhanced as the n-type region, which allows the potential barrier to be heightened. This is also beneficial in suppressing the signal crosstalk between the pixels.

Modification Example 4

FIG. 12 illustrates a cross-sectional configuration of a light receiving device (a light receiving device 1D) according to a modification example 4. As with the above-described embodiment, the light receiving device 1D includes, for example, the photoelectric conversion layer 12 and the plurality of contact layers 13 in this order on the substrate 11, and the plurality of contact layers 13 are formed on the photoelectric conversion layer 12 at the spacing intervals A with respect to one another. The first electrode 14 is electrically coupled to each of the plurality of contact layers 13 through the opening H of the mask layer 19. A covering layer (a covering layer 15D) and the insulating film 16 are formed in this order to cover a portion (the surface 12a) of the front surface of the photoelectric conversion layer 12 and the side surface 13a of each of the contact layers 13. A diffusion region (a diffusion region 17D) including an impurity is formed in a region adjacent to the covering layer 15D of the photoelectric conversion layer 12 and the contact layers 13. For example, the second electrode 18 is formed on the surface on the side opposite to the photoelectric conversion layer 12 of the substrate 11. In the light receiving device 1, for example, the rear surface of the second electrode 18 serves as the light entrance surface S1.

In the present modification example, however, the covering layer 15D includes a Group IV semiconductor (for example, Si), and an impurity element functioning as an n-type dopant for the compound semiconductor (the photoelectric conversion layer 12). Examples of an element functioning as a n-type dopant for InGaAs, for example, include one or more kinds of carbon (C), tin (Sn), lead (Pb), sulfur (S), tellurium (Te), etc. By the annealing treatment as described above, the one or more kinds of C, Sn, Pb, S, and Te that are included in the covering layer 15D are diffused into a portion of the photoelectric conversion layer 12 and the contact layers 13, leading to formation of the diffusion region 17D. Therefore, the diffusion region 17D includes the one or more kinds of C, Sn, Pb, S, and Te as the n-type dopant in the photoelectric conversion layer 12, and forms a high-density n-type region.

In the light receiving device 1D of the present modification example as well, the covering layer 15D including the Group IV semiconductor comes in contact with the surface 12a of the photoelectric conversion layer 12, which reduces the interface defect density as compared with a case of contacting with the insulating film. This makes it possible to obtain effects similar to those achieved in the above-described embodiment. Further, in the diffusion region 17D, an element including Si and functioning as the n-type dopant is diffused from the covering layer 15D. This makes it possible to form an n-type region with higher doping density in the diffusion region 17D, and to form a high potential barrier in the photoelectric conversion layer 12.

Modification Example 5

FIG. 13 illustrates a cross-sectional configuration of a light receiving device (a light receiving device 1E) according to a modification example 5. FIG. 14 illustrates a planar configuration of the light receiving device 1E in a schematic manner. As with the above-described embodiment, the light receiving device 1E includes, for example, the photoelectric conversion layer 12 and the plurality of contact layers 13 in this order on the substrate 11, and the plurality of contact layers 13 are provided on the photoelectric conversion layer 12 at the spacing intervals A with respect to one another. The first electrode 14 is electrically coupled to each of the plurality of contact layers 13 through the opening H of the mask layer 19. The covering layer 15 and The insulating film 16 are formed in this order to cover a portion (the surface 12a) of the front surface of the photoelectric conversion layer 12 and the side surface 13a of each of the contact layers 13. The diffusion region 17 is formed in a region adjacent to the covering layer 15 of the photoelectric conversion layer 12 and the contact layers 13. For example, the second electrode 18 is formed on the surface on the side opposite to the photoelectric conversion layer 12 of the substrate 11. In the light receiving device 1, for example, the rear surface of the second electrode 18 serves as the light entrance surface S1.

In the present modification example, however, a contact electrode (an electrode 14A) that is electrically coupled to the diffusion region 17 of the photoelectric conversion layer 12 is disposed. It is only necessary for the electrode 14A to be electrically coupled to the diffusion region 17, and the electrode 14A may be formed at any position on the photoelectric conversion layer 12. Further, only one electrode 14A or a plurality of electrode 14A may be disposed for the light receiving device 1E.

In the light receiving device 1E of the present modification example as well, the covering layer 15 comes in contact with the surface 12a of the photoelectric conversion layer 12, which reduces the interface defect density as compared with a case of contacting with the insulating film. Further, a potential barrier is formed in the photoelectric conversion layer 12 by the diffusion region 17. This makes it possible to obtain effects similar to those achieved in the above-described embodiment.

Further, including the electrode 14A that is electrically coupled to the diffusion region 17 allows for potential control of the diffusion region 17. For example, applying a positive-bias voltage to the electrode 14A allows for an increase in electron density in the vicinity of the surface 12a of the photoelectric conversion layer 12. Such potential control with use of the electrode 14A makes it possible to decrease the probability of recombination of interface formation, and to enhance electrical separation from the adjoining pixels. This is beneficial in suppressing the dark current.

Modification Example 6

FIG. 15 illustrates a cross-sectional configuration of a light receiving device (a light receiving device 1F) according to a modification example 6. As with the above-described embodiment, the light receiving device 1F includes, for example, the photoelectric conversion layer 12 and the plurality of contact layers 13 in this order on the substrate 11, and the plurality of contact layers 13 are provided on the photoelectric conversion layer 12 at the spacing intervals A with respect to one another. The first electrode 14 is electrically coupled to each of the plurality of contact layers 13 through the opening H of the mask layer 19. The covering layer 15 and insulating films (insulating films 16 and 16B) are formed in this order to cover a portion (the surface 12a) of the front surface of the photoelectric conversion layer 12 and the side surface 13a of each of the contact layers 13. The diffusion region 17 is formed in a region adjacent to the covering layer 15 of the photoelectric conversion layer 12 and the contact layers 13. For example, the second electrode 18 is formed on the surface on the side opposite to the photoelectric conversion layer 12 of the substrate 11. In the light receiving device 1, for example, the rear surface of the second electrode 18 serves as the light entrance surface S1.

In the present modification example, however, the insulating film 16B (a second insulating film) is further stacked on the insulating film 16, and the insulating film 16B includes a positive fixed electrical charge. It is possible to form the insulating film 16B including such a positive fixed electrical charge by using SiN, $SiO_2$, and $HfO_2$ for film formation through CVD, for example.

In the light receiving device 1F of the present modification example as well, the covering layer 15 comes in contact with the surface 12a of the photoelectric conversion layer 12, which reduces the interface defect density as compared with a case of contacting with the insulating film. Further, a potential barrier is formed in the photoelectric conversion layer 12 by the diffusion region 17. This makes it possible to obtain effects similar to those achieved in the above-described embodiment.

Further, stacking the insulating film 16B including the positive fixed electrical charge on the covering layer 15 induces electrons at an interface between the Group IV semiconductor (the covering layer 15) and the insulating film 16, thereby making it possible to achieve the effects of reducing the probability of recombination of interface formation and of improving a separation property.

Application Example 1

FIG. 16 illustrates a functional configuration of an imaging device 2 using a device structure of the light receiving device 1 (any of the light receiving devices 1A to 1F is also applicable) that is described in the above-described embodiment, etc. The imaging device 2 is, for example, an infrared image sensor, and includes, for example, a pixel section 10A, and a circuit section 20 that drives the pixel section 10A. The circuit section 20 includes, for example, a row scanner 131, a horizontal selector 133, a column scanner 134, and a system controller 132.

The pixel section 10A includes a plurality of pixels P that are two-dimensionally disposed in a matrix pattern, for example. The pixels P are wired with, for example, pixel driving lines Lread (for example, line selective lines and reset control lines) for respective pixel rows, and are wired with vertical signal lines Lsig for respective pixel columns. The pixel driving lines Lread transmit drive signals for reading of signals from the pixels P. The pixel driving lines Lread each have one end coupled to a corresponding one of output terminals, corresponding to the respective rows, of the row scanner 131.

The row scanner 131 is a pixel driver that includes a shift register, an address decoder, etc., and drives each of the pixels P in the pixel section 10A on a row basis, for example. A signal outgoing from each of the pixels P of a pixel row that is selectively scanned by the row scanner 131 is supplied to the horizontal selector 133 through each of the vertical signal lines Lsig. The horizontal selector 133 includes an amplifier, a horizontal selective switch, etc. that are provided for each of the vertical signal line Lsig.

The column scanner 134 includes a shift register, an address decoder, etc., and drives respective horizontal selective switches of the horizontal selector 133 in sequence while scanning those horizontal selective switches. Through selective scanning performed by the column scanner 134, a signal of each pixel to be transmitted through each of the vertical signal lines Lsig is outputted to a horizontal signal line 135 in sequence, and is inputted to an unillustrated signal processor, etc. through the horizontal signal line 135.

In the imaging device 2, for example, a substrate 2A including the pixel section 10A and a substrate 2B including the circuit section 20 are stacked, as illustrated in FIG. 17. However, a configuration of the imaging device 2 is not limited thereto, and the circuit section 20 may be formed on the same substrate as the substrate 2A including the pixel section 10A, or may be formed on an external control IC. Alternatively, the circuit section 20 may be formed on another substrate that is coupled through a cable, etc.

The system controller 132 receives a clock given from outside, data on instructions of operation modes, etc., and outputs data such as internal information of the imaging device 2. The system controller 132 further includes a timing generator that generates a variety of timing signals, and performs drive control of the row scanner 131, the horizontal selector 133, the column scanner 134, etc. on the basis of the various timing signals generated by the timing generator.

Application Example 2

The above-described imaging device 2 is applicable to various types of electronic apparatuses such as a camera with a capability of imaging an infrared region, for example. As an example thereof, FIG. 18 illustrates a simplified configuration of an electronic apparatus 3 (a camera). The electronic apparatus 3 is a camera that is able to shoot, for example, still images or moving images, and includes the imaging device 2, an optical system (an optical lens) 310, a shutter unit 311, a driver 313 that drives the imaging device 2 and the shutter unit 311, and a signal processor 312.

The optical system 310 guides image light (incoming light) from a subject to the imaging device 2. The optical system 310 may include a plurality of optical lenses. The shutter unit 311 controls a light irradiation period and a light shielding period for the imaging device 2. The driver 313 controls transfer operation of the imaging device 2, and shutter operation of the shutter unit 311. The signal processor 312 carries out a variety of signal processing on signals outgoing from the imaging device 2. An image signal Dout having been subjected to the signal processing is stored on a storage medium such as a memory, or is outputted to a monitor, etc.

The present disclosure is described thus far with reference to the embodiment, the modification examples, and the application examples; however, the contents of the present disclosure are not limited to the above-described embodiment, etc., and may be modified in a variety of ways. For example, a layered configuration of the light receiving device that is described in the above-described embodiment is illustrative only, and the light receiving device may further include any other layer. Further, a material and a thickness of each layer are also illustrative only, and are not limited to those described above.

Further, in the above-described embodiment, etc., a case where the contact layer 13 includes the p-type compound semiconductor, and the photoelectric conversion layer 12 includes the n-type compound semiconductor is exemplified; however, conductivity types of the contact layer 13 and the photoelectric conversion layer 12 are not limited thereto. Depending on a combination of the compound semiconductor and the impurity element serving as a dopant, the contact layer 13 may include an n-type compound semiconductor, and the photoelectric conversion layer 12 may include a p-type compound semiconductor.

Further, the effects described in the above-described embodiment, etc. are merely exemplified. The effects of the present disclosure may be other effects, or may further include other effects.

It is to be noted that the present disclosure may be configured as follows.

(1)

A light receiving device, including:

a photoelectric conversion layer that includes a first compound semiconductor, and absorbs a wavelength in an infrared region to generate electrical charges;

a plurality of contact layers that include a second compound semiconductor, and are provided on the photoelectric conversion layer at spacing intervals with respect to one another; and a covering layer that is formed to cover a portion corresponding to the spacing intervals of a front surface of the photoelectric conversion layer and side surfaces of the respective contact layers, and includes a Group IV semiconductor.

(2)

The light receiving device according to (1), in which the covering layer includes silicon (Si) or germanium (Ge).

(3)

The light receiving device according to (1) or (2), in which the covering layer includes silicon germanium (SiGe).

(4)

The light receiving device according to any one of (1) to (3), in which the covering layer includes the Group IV semiconductor, and an element functioning as an n-type dopant for the Group IV semiconductor.

(5)

The light receiving device according to any one of (1) to (4), in which the covering layer includes the Group IV semiconductor, and an element functioning as an n-type dopant for the photoelectric conversion layer.

(6)

The light receiving device according to any one of (1) to (5), in which a diffusion region where an element included in the covering layer is diffused is included in a selective region adjacent to the covering layer of the photoelectric conversion layer and the contact layers.

(7)

The light receiving device according to (6), further including a contact electrode that is electrically coupled to the diffusion region of the photoelectric conversion layer.

(8)

The light receiving device according to any one of (1) to (7), further including a first insulating film on the covering layer.

(9)

The light receiving device according to (8), in which the first insulating film includes any of silicon (Si), nitrogen (N), aluminum (Al), and hafnium (Hf).

(10)

The light receiving device according to (8) or (9), in which the covering layer includes germanium, and the first insulating film is formed on the covering layer with an insulating film including germanium oxide ($GeO_2$) in between.

(11)

The light receiving device according to any one of (8) to (10), further including a second insulating film including a positive fixed electrical charge on the first insulating film.

(12)

The light receiving device according to any one of (1) to (11), in which the first and second compound semiconductors are Group III-V semiconductors.

(13)

The light receiving device according to any one of (1) to (12), in which a thickness of the covering layer is from 0.25 nm to 100 nm both inclusive.

(14)

The light receiving device according to any one of (1) to (13), in which the photoelectric conversion layer is of an n type having doping density of $1.0 \times 10^{18}$ $cm^{-3}$ or less, or of a p type having doping density of $1.0 \times 10^{16}$ $cm^{-3}$ or less.

(15)

The light receiving device according to any one of (1) to (14), in which the photoelectric conversion layer and the contact layer are provided in this order on a substrate, the light receiving device further including:

a first electrode that is electrically coupled to the contact layer, and a second electrode that is electrically coupled to the substrate.

(16)

A method of manufacturing a light receiving device, the method including:

forming a photoelectric conversion layer that includes a first compound semiconductor, and absorbs a wavelength in an infrared region to generate electrical charges;

forming a plurality of contact layers that include a second compound semiconductor, and are disposed on the photoelectric conversion layer at spacing intervals with respect to one another; and forming a covering layer including a Group IV semiconductor that covers a portion corresponding to the spacing intervals of a front surface of the photoelectric conversion layer and side surfaces of the respective contact layers.

(17)

The method of manufacturing the light receiving device according to (16), in which the spacing intervals between the plurality of contact layers are formed through etching.

(18)

The method of manufacturing the light receiving device according to (16) or (17), in which an annealing treatment is performed after forming the covering layer to form a diffusion region where an element included in the covering layer is diffused in a selective region adjacent to the covering layer of the photoelectric conversion layer and the contact layers.

(19)

An imaging device including a plurality of pixels, the imaging device including:

a photoelectric conversion layer that includes a first compound semiconductor, and absorbs a wavelength in an infrared region to generate electrical charges;

a plurality of contact layers that include a second compound semiconductor, and are provided on the photoelectric conversion layer at spacing intervals with respect to one another on a pixel basis; and a covering layer that is formed to cover a portion corresponding to the spacing intervals of a front surface of the photoelectric conversion layer and side surfaces of the respective contact layers, and includes a Group IV semiconductor.

(20)

An electronic apparatus provided with an imaging device, the imaging device including a plurality of pixels, and including:

a photoelectric conversion layer that includes a first compound semiconductor, and absorbs a wavelength in an infrared region to generate electrical charges;

a plurality of contact layers that include a second compound semiconductor, and are provided on the photoelectric conversion layer at spacing intervals with respect to one another on a pixel basis; and a covering layer that is formed to cover a portion corresponding to the spacing intervals of a front surface of the photoelectric conversion layer and side surfaces of the respective contact layers, and includes a Group IV semiconductor.

This application claims the benefit of Japanese Priority Patent Application JP2016-8460 filed with the Japan Patent Office on Jan. 20, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A method of manufacturing a light receiving device, the method comprising:

forming a photoelectric conversion layer that includes a first compound semiconductor, and absorbs a wavelength in an infrared region to generate electrical charges;

forming a plurality of contact layers that include a second compound semiconductor, and are disposed on the photoelectric conversion layer at spacing intervals with respect to one another; and forming a covering layer including a Group IV semiconductor that covers a portion corresponding to the spacing intervals of a front surface of the photoelectric conversion layer and side surfaces of the respective contact layers.

2. The method of manufacturing the light receiving device according to claim 1, wherein the spacing intervals between the plurality of contact layers are formed through etching.

3. The method of manufacturing the light receiving device according to claim 1, wherein an annealing treatment is performed after forming the covering layer to form a diffusion region where an element included in the covering layer is diffused in a selective region adjacent to the covering layer of the photoelectric conversion layer and the contact layers.

4. The method of manufacturing the light receiving device according to claim 1, wherein the covering layer includes silicon (Si) or germanium (Ge).

5. The method of manufacturing the light receiving device according to claim 1, wherein the covering layer includes silicon germanium (SiGe).

6. The method of manufacturing the light receiving device according to claim 1, wherein the covering layer includes the Group IV semiconductor, and an element functioning as a n-type dopant for the Group IV semiconductor.

7. The method of manufacturing the light receiving device according to claim 1, wherein the covering layer includes the Group IV semiconductor, and an element functioning as a n-type dopant for the photoelectric conversion layer.

8. The method of manufacturing the light receiving device according to claim 1, wherein a diffusion region where an element included in the covering layer is diffused is included in a selective region adjacent to the covering layer of the photoelectric conversion layer and the contact layers.

9. The method of manufacturing the light receiving device according to claim 8, further comprising a contact electrode that is electrically coupled to the diffusion region of the photoelectric conversion layer.

10. The method of manufacturing the light receiving device according to claim 1, further comprising a first insulating film on the covering layer.

11. The method of manufacturing the light receiving device according to claim 10, wherein the first insulating film includes any of silicon (Si), nitrogen (N), aluminum (Al), and hafnium (Hf).

12. The method of manufacturing the light receiving device according to claim 10, wherein
the covering layer includes germanium, and
the first insulating film is formed on the covering layer with an insulating film including germanium oxide ($GeO_2$) in between.

13. The method of manufacturing the light receiving device according to claim 10, further comprising a second insulating film including a positive fixed electrical charge on the first insulating film.

14. The method of manufacturing the light receiving device according to claim 1, wherein the first and second compound semiconductors are Group III-V semiconductors.

15. The method of manufacturing the light receiving device according to claim 1, wherein a thickness of the covering layer is from 0.25 nm to 100 nm both inclusive.

16. The method of manufacturing the light receiving device according to claim 1, wherein the photoelectric conversion layer is of a n type having doping density of $1.0 \times 10^{18}$ cm$^{-3}$ or less, or of a p type having doping density of $1.0 \times 10^{16}$ cm$^{-3}$ or less.

17. The method of manufacturing the light receiving device according to claim 1, wherein the photoelectric conversion layer and the contact layers are provided in this order on a substrate, the light receiving device further comprising:
a first electrode that is electrically coupled to the contact layers, and
a second electrode that is electrically coupled to the substrate.

18. The method of manufacturing the light receiving device according to claim 1, wherein the photoelectric conversion layer and the contact layers are epitaxially grown.

19. The method of manufacturing the light receiving device according to claim 1, wherein the pacing intervals are formed by etching.

20. The method of manufacturing the light receiving device according to claim 1, wherein the covering layer is formed by deposition, followed by patterning.

* * * * *